(12) United States Patent
Tseng et al.

(10) Patent No.: US 8,471,995 B2
(45) Date of Patent: Jun. 25, 2013

(54) FLEXIBLE DISPLAY PANEL

(75) Inventors: Shih-Hao Tseng, Tainan (TW); Shih-Hsing Hung, Hsinchu County (TW); Chih-Jen Hu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 337 days.

(21) Appl. No.: 12/949,787

(22) Filed: Nov. 19, 2010

(65) Prior Publication Data
US 2012/0062447 A1    Mar. 15, 2012

(30) Foreign Application Priority Data
Sep. 10, 2010 (TW) .............................. 99130679 A (51) Int. Cl.
    *G02F 1/1343*    (2006.01)
    *G02F 1/1339*    (2006.01)
(52) U.S. Cl.
    USPC ............................................. 349/145; 349/158
(58) Field of Classification Search
    USPC ........................................ 349/145, 147, 158
    See application file for complete search history.

(56) References Cited

U.S. PATENT DOCUMENTS

| | | | | |
|---|---|---|---|---|
| 5,045,753 | A * | 9/1991 | Katayama et al. | 313/494 |
| 6,501,528 | B1 | 12/2002 | Hamada | |
| 6,654,074 | B1 * | 11/2003 | Ha et al. | 349/40 |
| 7,495,736 | B2 * | 2/2009 | Chen et al. | 349/145 |
| 7,995,182 | B2 * | 8/2011 | Choi | 349/147 |
| 2005/0045885 | A1 | 3/2005 | Kim et al. | |
| 2007/0019143 | A1 | 1/2007 | Chen et al. | |
| 2008/0268738 | A1 * | 10/2008 | Kanai et al. | 445/24 |

FOREIGN PATENT DOCUMENTS

| | | |
|---|---|---|
| JP | 64-080521 | 3/1989 |
| TW | I269450 | 12/2006 |
| TW | I275863 | 3/2007 |
| TW | 200919398 | 5/2009 |

OTHER PUBLICATIONS

"First Office Action of China Counterpart Application", issued on Jan. 30, 2012, p. 1-p. 5.

* cited by examiner

*Primary Examiner* — Edward Glick
*Assistant Examiner* — David Chung
(74) *Attorney, Agent, or Firm* — Jianq Chyun IP Office (57) ABSTRACT

A flexible display panel includes a flexible substrate, a plurality of pixels, a plurality of signal lines, a plurality of wave-like connecting lines, and a display medium. The flexible substrate has a plurality of display regions separated from one another and at least one foldable region located among the display regions. The pixels are disposed in the display regions. The signal lines are disposed on the flexible substrate and electrically connected to the pixels. The wave-like connecting lines are distributed in and across the foldable region. Each of the wave-like connecting lines is electrically connected to two of the signal lines adjacent to the wave-like connecting line. Each of the wave-like connecting lines across the foldable region has a wave-like pattern. The display medium is disposed on the flexible substrate to cover at least the display regions.

15 Claims, 5 Drawing Sheets

FLEXIBLE DISPLAY PANEL

CROSS-REFERENCE TO RELATED APPLICATION

This application claims the priority benefit of Taiwan application serial no. 99130679, filed on Sep. 10, 2010. The entirety of the above-mentioned patent application is hereby incorporated by reference herein and made a part of this specification.

BACKGROUND OF THE INVENTION

1. Field of the Invention

The invention relates to a display panel, and in particular to a foldable display panel or a flexible display panel.

2. Description of Related Art

With rapid development of display technologies, conventional cathode ray tube (CRT) displays have been gradually replaced by flat panel displays (FPD). In comparison with the FPD formed by a rigid carrier (e.g., a glass substrate), a flexible display in which an active device is formed on a flexible substrate has been developed according to recent researches because the flexible substrate (e.g., a plastic substrate) is characterized by flexibility and impact endurance.

In general, when the active device is to be formed on the flexible substrate, the flexible substrate is often adhered to the rigid carrier, and then a series of film fabrication processes (e.g., formation of scan lines, data lines, pixel units, storage capacitors, gate insulating layers, protection layers, and so on) can be performed to form a flexible display panel. Driver ICs (e.g., a scan driver IC and a data driver IC) are then adhered to the flexible display panel through an anisotropic conductive adhesive, such that conductive bumps of the driver ICs are electrically connected to pads of the flexible display panel through conductive particles in the anisotropic conductive adhesive, and that the flexible display panel is electrically connected to the driver ICs. After all the processes are completely performed, the flexible display panel is removed from the rigid carrier.

Nonetheless, in the process of fabricating the flexible display panel, the scan lines in a pixel array cross over display regions and foldable regions, and the scan lines are not specifically designed. Hence, after the flexible display panel is bent over and over, stress is likely to be accumulated on the scan lines that cross over the display regions and the foldable regions, and thus circuits in the foldable regions of the flexible display panel (i.e., parts of the scan lines) are apt to be broken. Thereby, reliability of the flexible display panel is reduced.

SUMMARY OF THE INVENTION

The invention is directed to a flexible display panel that has favorable reliability.

The invention provides a flexible display panel that includes a flexible substrate, a plurality of pixels, a plurality of signal lines, a plurality of wave-like connecting lines, and a display medium. The flexible substrate has a plurality of display regions separated from one another and at least one foldable region located among the display regions. The pixels are disposed in the display regions. The signal lines are disposed on the flexible substrate and electrically connected to the pixels. The wave-like connecting lines are distributed in and across the folded region. Each of the wave-like connecting lines is electrically connected to two of the signal lines adjacent thereto, and each of the wave-like connecting lines across the foldable region has a wave-like pattern. The display medium is disposed on the flexible substrate to cover at least the display regions.

According to an embodiment of the invention, the signal lines include a plurality of scan lines, a plurality of data lines, a plurality of common lines, a plurality of conductive lines for transmitting power, and/or a plurality of conductive lines transmitting reference voltages.

According to an embodiment of the invention, each of the wave-like connecting lines is a metal conductive line having a continuous pattern.

According to an embodiment of the invention, each of the wave-like connecting lines includes a plurality of non-continuous metal conductive lines and a plurality of non-continuous flexible conductive materials. Each of the flexible conductive materials is connected to two of the non-continuous metal conductive lines adjacent thereto.

According to an embodiment of the invention, each of the wave-like connecting lines includes a metal conductive line and a flexible conductive material layer. The metal conductive line and the flexible conductive material layer both have a continuous pattern. The flexible conductive material layer having the continuous pattern is stacked onto the metal conductive line having the continuous pattern.

According to an embodiment of the invention, each of the wave-like connecting lines has a square wave pattern.

According to an embodiment of the invention, each of the wave-like connecting lines has a sine wave pattern.

According to an embodiment of the invention, each of the wave-like connecting lines has a saw-toothed pattern.

According to an embodiment of the invention, each of the wave-like connecting lines is made by performing an ink-jet printing process.

According to an embodiment of the invention, the flexible display panel further includes a flexible cover lid and a sealant. The flexible cover lid is disposed at one side of the flexible substrate, and the display medium is located between the flexible cover lid and the flexible substrate. The sealant is disposed between the flexible substrate and the flexible cover lid and surrounds the display medium.

The invention further provides a flexible display panel that includes a flexible substrate, a plurality of pixels, a plurality of signal lines, and a display medium. The flexible substrate has a plurality of display regions separated from one another and at least one foldable region located among the display regions. The pixels are disposed in the display regions. The signal lines are disposed on the flexible substrate and electrically connected to the pixels. Parts of the signal lines are distributed in the display regions and cross over the foldable region, and each of the signal lines that crosses over the foldable region has a wave-like conductive segment. The display medium is disposed on the flexible substrate to cover at least the display regions.

According to an embodiment of the invention, the signal lines include a plurality of scan lines, a plurality of data lines, a plurality of common lines, a plurality of conductive lines for transmitting power, and/or a plurality of conductive lines transmitting reference voltages.

According to an embodiment of the invention, each of the signal lines is a metal conductive line having a continuous pattern.

According to an embodiment of the invention, each of the wave-like conductive segments includes a plurality of non-continuous metal conductive lines and a plurality of non-continuous flexible conductive materials. Each of the flexible conductive materials is connected to two of the non-continuous metal conductive lines adjacent thereto.

According to an embodiment of the invention, each of the wave-like conductive segments includes a metal conductive line and a flexible conductive material. The metal conductive line and the flexible conductive material both have a continuous pattern. The flexible conductive material layer having the continuous pattern is stacked onto the metal conductive line having the continuous pattern.

According to an embodiment of the invention, each of the wave-like conductive segments has a square wave pattern, a sine wave pattern or a saw-toothed pattern.

According to an embodiment of the invention, the flexible display panel further includes a flexible cover lid and a sealant. The flexible cover lid is disposed at one side of the flexible substrate, and the display medium is located between the flexible cover lid and the flexible substrate. The sealant is disposed between the flexible substrate and the flexible cover lid and surrounds the display medium.

Based on the above, the circuit design of the foldable region is enhanced in this invention. Namely, the circuits in the foldable region of the flexible display panel are less likely to be broken because of the design of the wave-like connecting lines or the wave-like conductive segments. As such, reliability of the flexible display panel can be improved in this invention.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
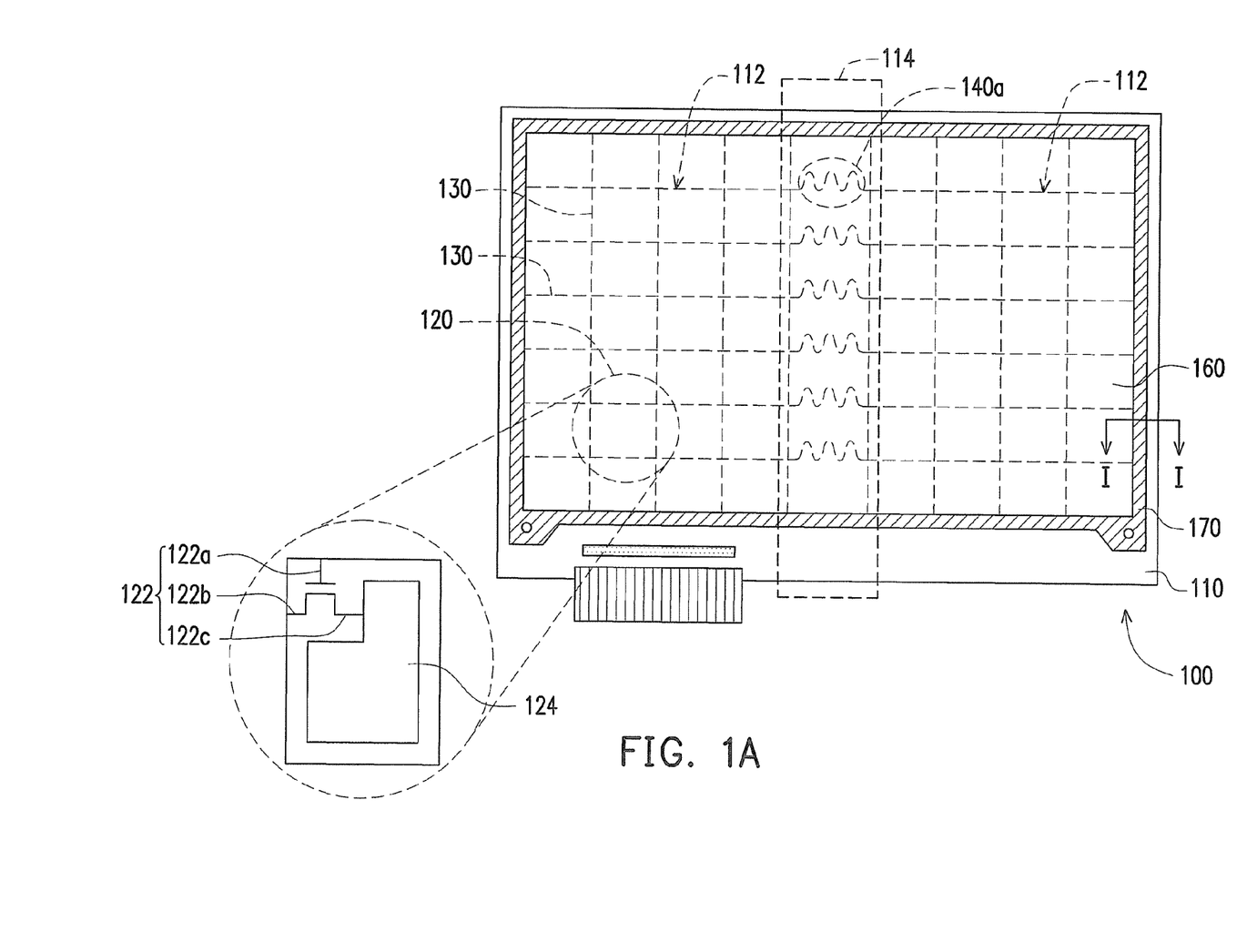
FIG. 1A is a schematic top view illustrating a flexible display panel according to an embodiment of the invention.
Figure 1B:
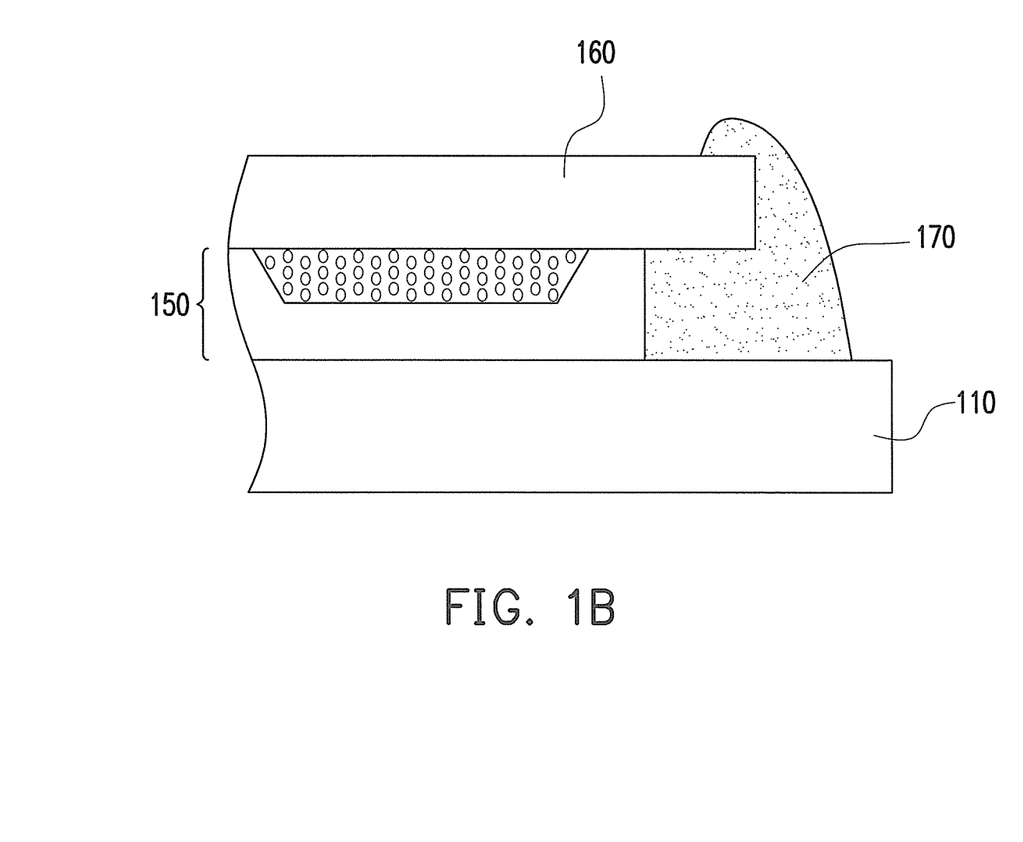
FIG. 1B is a schematic cross-sectional view taken along a line I-I in FIG. 1A.
Figure 2A:
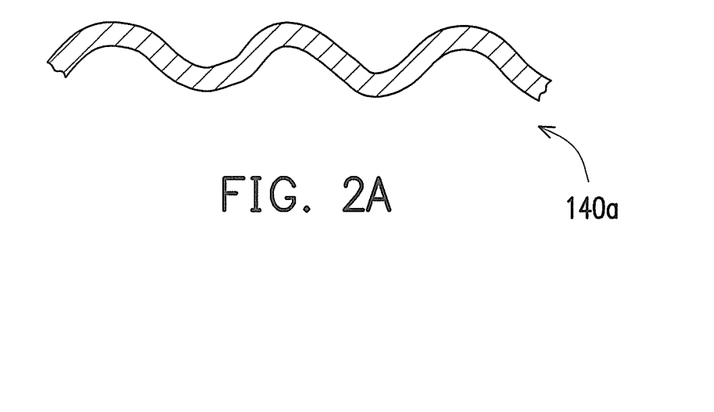
FIG. 2A is a schematic enlarged view illustrating wave-like connecting lines in FIG. 1A.

FIG. 1A is a schematic top view illustrating a flexible display panel according to an embodiment of the invention. FIG. 1B is a schematic cross-sectional view taken along a line I-I in FIG. 1A. FIG. 2A is a schematic enlarged view illustrating wave-like connecting lines in FIG. 1A. With reference to FIG. 1A and FIG. 1B, in this embodiment, the flexible display panel 100 includes a flexible substrate 110 (or a foldable substrate), a plurality of pixels 120, a plurality of signal lines 130, a plurality of wave-like connecting lines 140a, and a display medium 150. The flexible substrate 110 includes a plastic substrate or a composite substrate that is formed by stacking a plastic substrate and a glass substrate. The display medium 150 includes an electrophoretic display material, a liquid crystal display material, an organic luminescent display material, a plasma display material, a field emission display material, and so forth. Here, the electrophoretic display material can be a micro-cup electrophoretic display material or a micro-capsule electrophoretic display material, which is well known to people having ordinary skill in the art and therefore will not be further described.

To be more specific, the flexible substrate 110 has a plurality of display regions 112 separated from one another and at least one foldable region 114 located among the display regions 112. In FIG. 1A, only two of the display regions 112 are schematically shown. Note that the foldable region 114 can be plural in other embodiments of the invention based on actual design requirements. The pixels 120 are disposed in the display regions 112, and each of the pixels 120 includes a thin film transistor (TFT) 122 and a pixel electrode 124. The TFT 122 has a gate 122a, a source 122b, and a drain 122c, and the pixel electrode 124 directly contacts the drain 122c.

The signal lines 130 are disposed on the flexible substrate 110 and electrically connected to the pixels 120. Here, the signal lines 130 are, for instance, a plurality of scan lines, a plurality of data lines, a plurality of common lines, a plurality of conductive lines for transmitting power, and/or a plurality of conductive lines transmitting reference voltages. The signal lines 130 may have one or more kinds of above lines. As indicated in FIG. 1A, the signal lines 130 are the scan lines and the data lines, and each of the pixels 120 is electrically connected to the corresponding scan line and the corresponding data line.

With reference to FIG. 1A and FIG. 2A, in this embodiment, the wave-like connecting lines 140a are distributed in and across the foldable region 114. Specifically, each of the wave-like connecting lines 140a is electrically connected to two of the signal lines 130 adjacent thereto, and each of the wave-like connecting lines 140a across the foldable region 114 has a wave-like pattern. The wave-like connecting lines 140a and the two signal lines 130 adjacent thereto can be made of the same conductive material or different conductive materials. In an alternative embodiment, each of the signal lines 120 across the foldable region 114 has a wave-like conductive segment (i.e., the wave-like connecting line 140a). Here, each of the wave-like connecting lines 140a is a metal conductive line that has a continuous pattern, and each of the wave-like connecting lines 140a has a sine wave pattern. However, the invention is not limited thereto. It should be mentioned that each of the wave-like connecting lines 140a of this embodiment is made by performing an ink-jet printing process, for instance.

With reference to FIG. 1A and FIG. 1B, the display medium 150 of this embodiment is disposed on the flexible substrate 110 to cover at least the display regions 112. In this embodiment, the display medium 150 is an electronic paper display (EPD) film made of the electrophoretic display material, for instance. In addition, the flexible display panel 100a of this embodiment further includes a flexible cover lid 160 and a sealant 170. The flexible cover lid 160 is disposed at one side of the flexible substrate 110, and the display medium 150 is located between the flexible cover lid 160 and the flexible substrate 110. The sealant 170 is disposed between the flexible substrate 110 and the flexible cover lid 160 and surrounds the display medium 150. In an alternative embodiment, a sealing material can be used to directly cover the display medium 150 and the flexible substrate 110 in the flexible display panel 100a, so as to form the flexible display panel package directly.

The flexible display panel 100 of this embodiment has the wave-like connecting lines 140a, and thereby the circuits of the flexible display panel 100 (i.e., the wave-like conductive segments of the signal lines 130 or the wave-like connecting lines 140a) are less likely to be broken. Moreover, reliability of the flexible display panel 100 can be improved.

Figure 2B:
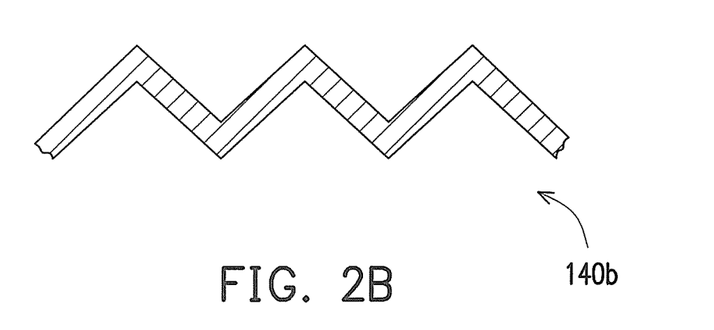
FIG. 2B is a schematic enlarged view illustrating wave-like connecting lines with a saw-toothed pattern according to an embodiment of the invention.
Figure 2C:
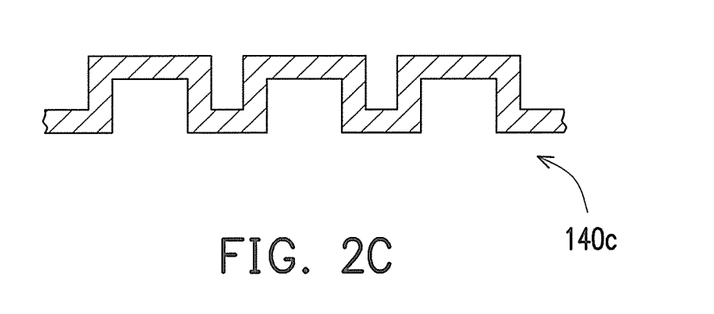
FIG. 2C is a schematic enlarged view illustrating wave-like connecting lines with a square wave pattern according to an embodiment of the invention.

It should be mentioned that the pattern of the wave-like connecting lines 140a is not limited in this invention, while the wave-like connecting lines 140a herein substantially have the sine wave pattern. In other embodiments of the invention, as indicated in FIG. 2B, each of the wave-like connecting lines 140b has a saw-toothed pattern, for instance. Alternatively, as shown in FIG. 2C, each of the wave-like connecting lines 140c has a square wave pattern, for instance. The wave-like connecting lines 140a in FIG. 2A are merely exemplary and should not be construed as limitations to this invention.

The structure and the configuration of the wave-like connecting lines 140a are not limited in this invention. Although the wave-like connecting lines 140a herein are substantially metal conductive lines with the continuous pattern, other designs that can enhance the structures are also applicable in this invention and do not depart from the protection scope of the invention.

Figure 3A:
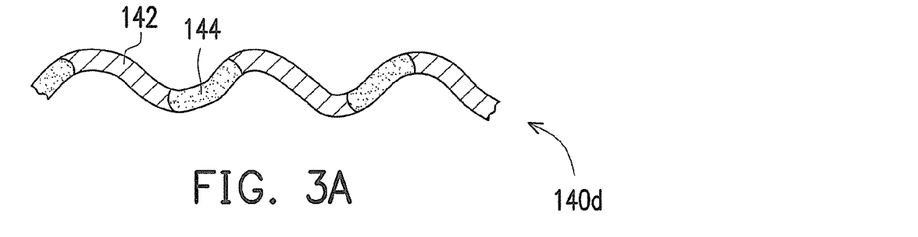
FIG. 3A is a schematic enlarged view illustrating wave-like connecting lines according to an embodiment of the invention.
Figure 3B:
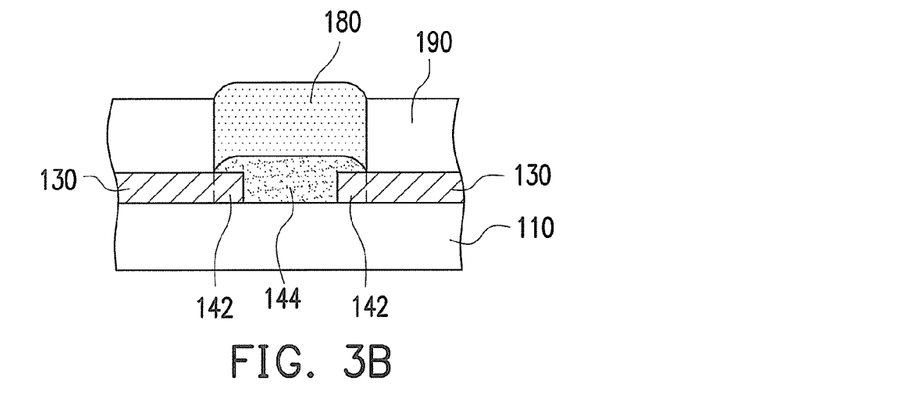
FIG. 3B is schematic cross-sectional partial view illustrating wave-like connecting lines and signal lines in FIG. 3A on a flexible substrate.

For example, with reference to FIG. 3A and FIG. 3B, in this embodiment, each of the wave-like connecting lines 140d can include a plurality of non-continuous metal conductive lines 142 and a plurality of non-continuous flexible conductive materials 144. Each of the flexible conductive materials 144 is connected to two of the non-continuous metal conductive lines 142 adjacent thereto. The flexible conductive materials 144 are made of conductive polymers, so as to comply with requirements for conductivity and flexibility. It should be mentioned that the non-continuous metal conductive lines 142 and the signal lines 130 are simultaneously formed in this embodiment, and the non-continuous flexible conductive materials 144 are formed by performing an ink-jet printing process, so as to enhance structural strength of the wave-like conductive segments in the signal lines 130 (i.e., the wave-like connecting lines 140d) across over the foldable region 114. Additionally, an insulating layer 180 is exemplarily disposed above the wave-like connecting lines 140d according to this embodiment in order to protect the wave-like connecting lines 140d. Besides, one or more film layers are disposed above the signal lines 130, for instance. Here, the film layers protecting the underlying signal lines 130 refer to insulating layers, conductive layers, or a combination thereof and should not be construed as a limitation to the invention.

Figure 4A:
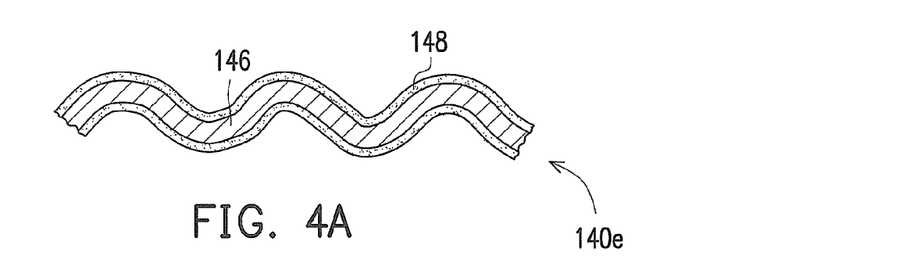
FIG. 4A is a schematic enlarged view illustrating wave-like connecting lines according to another embodiment of the invention.
Figure 4B:
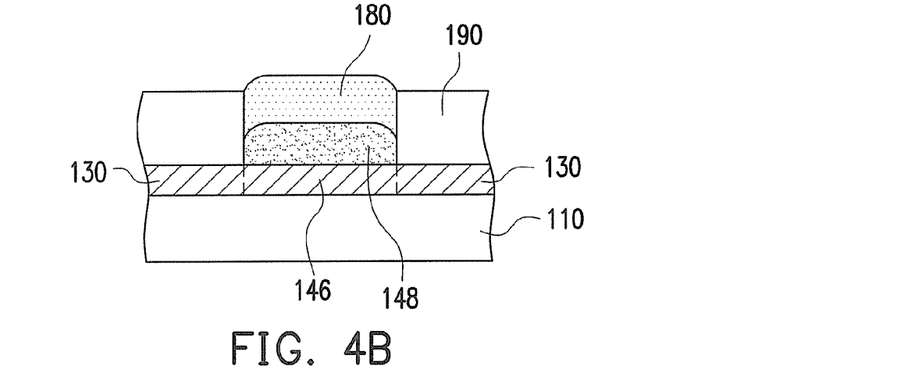
FIG. 4B is schematic cross-sectional partial view illustrating wave-like connecting lines and signal lines in FIG. 4A on a flexible substrate.

According to an embodiment of the invention, as indicated in FIG. 4A and FIG. 4B, each of the wave-like connecting lines 140e can include a metal conductive line 146 and a flexible conductive material layer 148. The metal conductive line 146 and the flexible conductive material layer 148 both have a continuous pattern. Here, the flexible conductive material layer 148 having the continuous pattern can be stacked onto the metal conductive line 146 having the continuous pattern. In brief, the wave-like connecting lines 140a in FIG. 2A are merely exemplary and should not be construed as a limitation to this invention.

To further ensure favorable reliability of the flexible display panel 100, a bending experiment is performed on conventional connecting lines (i.e., the scan lines that are not specifically designed) and different wave-like connecting lines with different patterns.

Figure 5A:
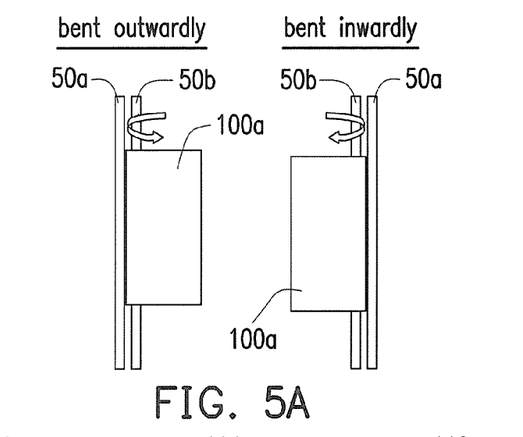
FIG. 5A is a schematic view illustrating a bending experiment performed on a flexible display panel.
Figure 5B:
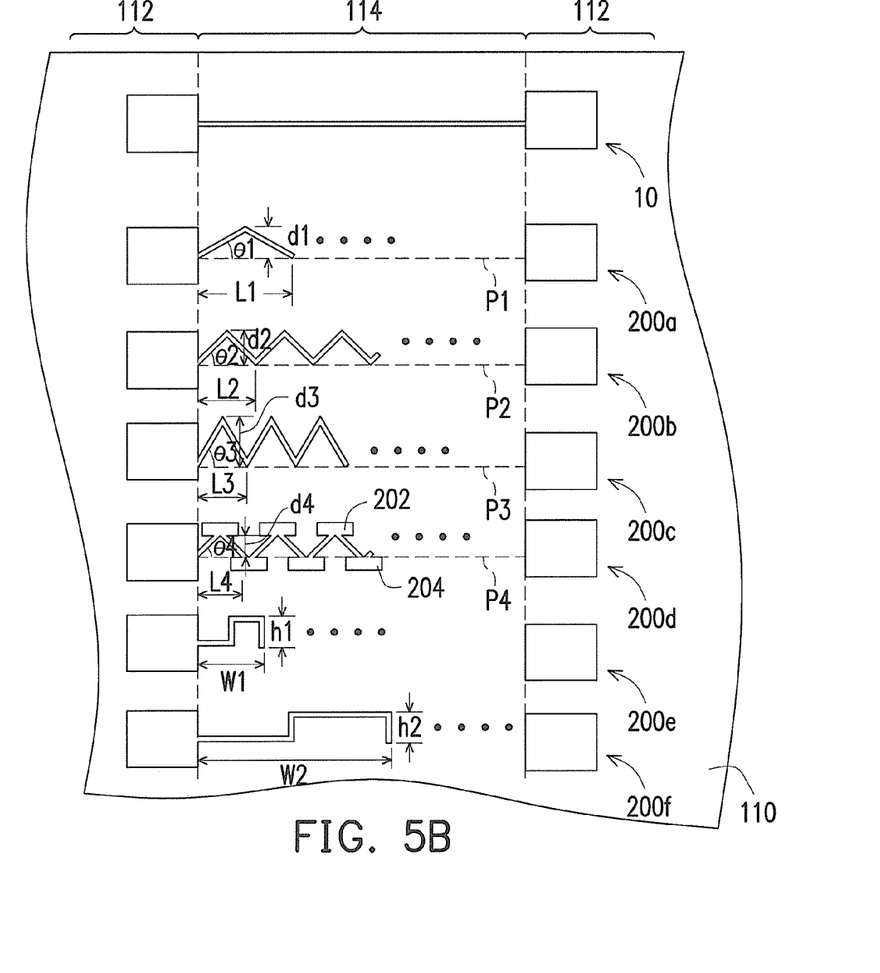
FIG. 5B is a schematic enlarged view illustrating wave-like connecting lines in FIG. 5A on a flexible display panel.

FIG. 5A is a schematic view illustrating a bending experiment performed on a flexible display panel. FIG. 5B is a schematic enlarged view illustrating wave-like connecting lines in FIG. 5A on a flexible display panel. With reference to FIG. 5A and FIG. 5B, in this embodiment, two rods 50a and 50b having the diameter of about 1 millimeter act as a clamp, and the bending experiment is performed when the foldable region 114 of the flexible display panel 100a is clamped by the two rods 50a and 50b. In each bending experiment, the flexible display panel 100a is bent inwardly and outwardly. Namely, when the flexible display panel 100a is bent inwardly, the display regions 112 of the flexible display panel 100a face each other; when the flexible display panel 100a is bent outwardly, the display regions 112 of the flexible display panel 100a face against each other. Besides, in the experimental examples 1~6 of the invention, the connecting lines in the foldable region 114 of the flexible display panel 100a include a plurality of wave-like connecting lines 200a~200f; in the comparison example of the invention, the connecting lines in the foldable region 114 of the flexible display panel 100a include a straight connecting line 10. The connecting line 10 in the comparison example and the wave-like connecting lines 200a~200f in the experimental examples are metal conductive lines with the line width of about 8 micrometers, and the length of the foldable region 114 is about 15 micrometers.

Particularly, the connecting line 10 in the comparison example is a straight conductive line that is not specifically designed. The wave-like connecting line 200a in the experimental example has the saw-toothed pattern. An included angle θ1 between each unit of the saw-toothed pattern and a reference planar line P1 is about 30 degrees; a distance d1 between the peak and the reference planar line P1 is about 10 micrometers, and the unit length L1 is about 34.6 micrometers. The wave-like connecting line 200b has the saw-toothed pattern. An included angle θ2 between each unit of the saw-toothed pattern and a reference planar line P2 can be about 45 degrees; a distance d2 between the peak and the reference planar line P2 can be about 10 micrometers, and the unit length L2 is about 20 micrometers. The wave-like connecting line 200c has the saw-toothed pattern. An included angle θ3 between each unit of the saw-toothed pattern and a reference planar line P3 can be about 60 degrees; a distance d3 between the peak and the reference planar line P3 can be about 10 micrometers, and the unit length L3 can be about 11.4 micrometers. The wave-like connecting line 200d has the saw-toothed pattern. An included angle θ4 between each unit of the saw-toothed pattern and a reference planar line P4 can be about 45 degrees; a distance d4 between the peak and the reference planar line P4 can be about 10 micrometers, and the unit length L4 can be about 20 micrometers. The peak and the valley of each unit of the saw-toothed pattern respectively may have a pillar 202 and a pillar 204 with the length of about 10 micrometers and the height of about 7 micrometers. The wave-like connecting line 200e may has the square wave pattern. Each unit of the square wave pattern has the unit width W1 of about 40 micrometers and the height h1 of about 20 micrometers. The wave-like connecting line 200f has the square wave pattern. Each unit of the square wave pattern has the unit width W2 of about 80 micrometers and the height h2 of about 20 micrometers. The bending experiment is performed respectively on the wave-like connecting lines 200a~200f in the experimental examples and the connecting line 10 in the comparison example for one time, five times, ten times, forty times, and fifty times. After the bending experiment is completely performed, the resistance is shown in the following table 1:

TABLE 1

| The number of bending experiments and resistance | Comparison example Straight connecting line 10 | Experimental example 1 Wave-like connecting line 200a | Experimental example 2 Wave-like connecting line 200b | Experimental example 3 Wave-like connecting line 200c | Experimental example 4 Wave-like connecting line 200d | Experimental example 5 Wave-like connecting line 200e | Experimental example 6 Wave-like connecting line 200f |
|---|---|---|---|---|---|---|---|
| Initial resistance | 196Ω | 208Ω | 193Ω | 129Ω | 191Ω | 231Ω | 223Ω |
| Resistance after 1 experiment | 195Ω | 208Ω | 194Ω | 129Ω | 191Ω | 230Ω | 221Ω |
| Resistance after 5 experiments | 195Ω | 208Ω | 192Ω | 129Ω | 191Ω | 231Ω | 221Ω |
| Resistance after 10 experiments | 195Ω | 208Ω | 194Ω | 129Ω | 191Ω | 235Ω | 224Ω |
| Resistance after 40 experiments | 311KΩ | 209Ω | 196Ω | 214Ω | 194Ω | 239Ω | 675Ω |
| Resistance after 50 experiments | 2000KΩ | 209Ω | 197Ω | 1.25KΩ | 192Ω | 242Ω | 141KΩ |

From table 1, it can be learned the resistance obtained after the bending experiment is performed on the straight connecting line 10 in the comparison example and on the wave-like connecting lines 200a~200f in the experimental examples for ten times falls within a normal range. That is to say, the structures of the straight connecting line 10 in the comparison example and the wave-like connecting lines 200a~200f in the experimental examples remain intact. However, after the bending experiment is performed on the straight connecting line 10 in the comparison example for 40 times or more, the resistance is significantly increased, and circuits can then be broken, which further deteriorates the reliability of the conventional flexible display panel. By contrast, after the bending experiment is performed on the wave-like connecting lines 200a~200d in the experimental examples for 40 times, the structural strength is still favorable. That is to say, the structures of the wave-like connecting lines 200a~200d remain intact. Accordingly, the specifically designed wave-like connecting lines 200a~200d of this invention can distribute the bending force applied on the entire flexible display panel 100 (as indicated in FIG. 1A) during the bending experiment, and the circuits of the flexible display panel 100 are less likely to be broken. Preferably, from table 1, it can be observed that the included angle between the reference planar line and each unit of the saw-toothed pattern of the wave-like connecting lines is less than 60 degrees, and the unit length is greater than 11.4 micrometers. Besides, the pillars 202 and 204 with the length of about 10 micrometers and the height of about 7 micrometers are disposed at the peak and the valley, respectively.

On the other hand, after the bending experiment is performed on the wave-like connecting lines 200e and 200f with the square wave pattern for 40 times, the structural strength is still favorable. That is to say, the structures of the wave-like connecting lines 200e and 200f remain intact. Nevertheless, after the bending experiment is performed on the wave-like connecting line 200f for fifty times, the resistance is signifi-cantly increased, and the circuits can then be broken. Namely, in the wave-like connecting lines with the square wave pattern, each unit of the square wave pattern preferably has the width of about 40 micrometers and the length of about 20 micrometers. To sum up, the specifically designed wave-like connecting lines 200a~200f of this embodiment can have desired structural strength, so as to effectively distribute the bending force applied when the flexible display panel 100 (as shown in FIG. 1A) is bent. As such, favorable reliability of the flexible display panel 100 of this embodiment can be guaranteed.

In light of the foregoing, the circuits in the foldable region are specifically designed in this invention; namely, the wave-like connecting lines are employed to effectively distribute the bending force applied when the entire flexible display panel is bent in an inward manner (e.g., the display regions of the flexible display panel face each other) or in an outward manner (e.g., the display regions of the flexible display panel face against each other). As such, the circuits of the flexible display panel are less likely to be broken, and reliability of the flexible display panel of this invention can be enhanced.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:
1. A flexible display panel comprising:
a flexible substrate having a plurality of display regions separated from one another and at least one foldable region located among the display regions;
a plurality of pixels disposed in the display regions;
a plurality of signal lines disposed on the flexible substrate and electrically connected to the pixels;
a plurality of wave-like connecting lines distributed in and across the at least one foldable region, each of the wave-like connecting lines being electrically connected to two of the signal lines adjacent to the each of the wave-like connecting lines, each of the wave-like connecting lines across the at least one foldable region having a wave-like pattern, wherein each of the wave-like connecting lines comprises:
a plurality of non-continuous metal conductive lines; and
a plurality of non-continuous flexible conductive materials, each of the non-continuous flexible conductive materials being connected to two of the non-continuous metal conductive lines adjacent to the each of the non-continuous flexible conductive materials; and
a display medium disposed on the flexible substrate to cover at least the display regions.

2. The flexible display panel as claimed in claim 1, wherein the signal lines comprise a plurality of scan lines, a plurality of data lines, a plurality of common lines, a plurality of conductive lines for transmitting power, or a plurality of conductive lines for transmitting reference voltages.

3. The flexible display panel as claimed in claim 1, wherein each of the wave-like connecting lines is a metal conductive line having a continuous pattern.

4. The flexible display panel as claimed in claim 1, wherein each of the wave-like connecting lines comprises:
a metal conductive line having a continuous pattern; and
a flexible conductive material layer having a continuous pattern and being stacked onto the metal conductive line having the continuous pattern.

5. The flexible display panel as claimed in claim 1, wherein each of the wave-like connecting lines has a square wave pattern.

6. The flexible display panel as claimed in claim 1, wherein each of the wave-like connecting lines has a sine wave pattern.

7. The flexible display panel as claimed in claim 1, wherein each of the wave-like connecting lines has a saw-toothed pattern.

8. The flexible display panel as claimed in claim 1, wherein each of the wave-like connecting lines is made by performing an ink-jet printing process.

9. The flexible display panel as claimed in claim 1, further comprising a flexible cover lid and a sealant, the flexible cover lid being disposed at one side of the flexible substrate, the display medium being located between the flexible cover lid and the flexible substrate, the sealant being disposed between the flexible substrate and the flexible cover lid and surrounding the display medium.

10. A flexible display panel comprising:
a flexible substrate having a plurality of display regions separated from one another and at least one foldable region located among the display regions;
a plurality of pixels disposed in the display regions;
a plurality of signal lines disposed on the flexible substrate and electrically connected to the pixels, wherein parts of the signal lines are distributed in the display regions and cross over the at least one foldable region, and each of the signal lines has a wave-like conductive segment crossing over the at least one foldable region, wherein the wave-like conductive segment comprises:
a plurality of non-continuous metal conductive lines; and
a plurality of non-continuous flexible conductive materials, each of the non-continuous flexible conductive materials being connected to two of the non-continuous metal conductive lines adjacent to the each of the non-continuous flexible conductive materials; and
a display medium disposed on the flexible substrate to cover at least the display regions.

11. The flexible display panel as claimed in claim 10, wherein the signal lines comprise a plurality of scan lines, a plurality of data lines, a plurality of common lines, a plurality of conductive lines transmitting power, or a plurality of conductive lines transmitting reference voltages.

12. The flexible display panel as claimed in claim 10, wherein each of the signal lines is a metal conductive line having a continuous pattern.

13. The flexible display panel as claimed in claim 10, wherein each of the wave-like conductive segments comprises:
a metal conductive line having a continuous pattern; and
a flexible conductive material having a continuous pattern and being stacked onto the metal conductive line having the continuous pattern.

14. The flexible display panel as claimed in claim 10, wherein each of the wave-like conductive segments has a square wave pattern, a sine wave pattern, or a saw-toothed pattern.

15. The flexible display panel as claimed in claim 10, further comprising a flexible cover lid and a sealant, the flexible cover lid being disposed at one side of the flexible substrate, the display medium being located between the flexible cover lid and the flexible substrate, the sealant being disposed between the flexible substrate and the flexible cover lid and surrounding the display medium.

* * * * *